United States Patent [19]

Hulderman et al.

[11] 3,854,083

[45] Dec. 10, 1974

[54] MILLIMETER WAVE MIXER

[75] Inventors: Garry N. Hulderman, Riverside; Leon J. Lader, Los Angeles; Jay B. Winderman, Claremont, all of Calif.

[73] Assignee: General Dynamics Corporation, Pomona, Calif.

[22] Filed: Oct. 11, 1973

[21] Appl. No.: 405,375

[52] U.S. Cl. ................ 321/69 W, 325/446, 333/11, 333/34, 333/98 R

[51] Int. Cl. ............................................ H01p 5/12

[58] Field of Search ... 321/69 W, 69 NL; 333/98 R, 333/98 S, 7 D, 11, 34; 325/445, 446

[56] References Cited

UNITED STATES PATENTS

| | | | |
|---|---|---|---|
| 3,263,154 | 7/1966 | Steele | 321/69 NL |
| 3,281,647 | 10/1966 | Hines et al. | 321/69 NL |
| 3,358,214 | 12/1967 | Schwarzmann | 321/69 W |
| 3,629,734 | 12/1971 | Siekanowicz | 333/11 |
| 3,646,357 | 2/1972 | Grace | 321/69 NL |
| 3,701,055 | 10/1972 | Stiles | 333/7 D |

*Primary Examiner*—R. N. Envall, Jr.
*Attorney, Agent, or Firm*—Henry M. Bissell; Edward B. Johnson

[57] ABSTRACT

A millimetric mixer package is fabricated in block construction manner of inexpensive lightweight materials such as plastics, after which the surfaces to be conductive are gold-plated. An integral collection box forms a part of the package, for the disposition of a circuit board and other elements in the output end of the mixer. The mixer provides a hybrid junction of magic T type for 2 millimeter wave inputs, one of which may be a local oscillator, the junction being coupled by way of a resultant balanced output signal to impedance matching ramp elements, at the output end of which are disposed biased diodes which are adjustably positioned for optimum noise figure. The conductors providing the diode bias terminate at a circuit board in the collection box whereat the difference frequency signal output may be taken.

14 Claims, 4 Drawing Figures

MILLIMETER WAVE MIXER

BACKGROUND OF THE INVENTION

1. Field of the Invention

The present invention is concerned generally with millimeter wave devices, and is particularly conccerned with mixers for converting millimeter wave energy of an ultra-high frequency to a lower frequency energy by employing a lower frequency to mix with the uhf to provide wave energy at a difference or intermediate frequency.

2. Description of the Prior Art

Current state-of-the-art millimeter wave balanced mixers are fabricated from sections of metal wavegudie soldered or brazed together. This technique requires much care in alignment of the sections, and can result in solder build-up by the leaking of excess solder inside the mixer; or, if not enough solder is employed, there will appear lossy internal cracks at the adjacent waveguide sections. This is a particularly critical problem especially at the very short wavelenghts where dimensions are very small. The problem may be compounded by the ultimate configuration of any joint since it is impossible to obtain an absolutely smooth surface at an intersection, even if exactly the correct amount of solder or brazed material is used. This is because of the natural tendency of the plastic molten solder or brazed material to form a miniscus at the joint.

Furthermore, the soldering or brazing heat applied during fabrication can cause warping of the thin metallic waveguide members.

SUMMARY OF THE INVENTION

The present invention provides a millimeter wave device, disclosed herein as a mixer to convert millimeter wave energy from an ultra or higher frequency to a lower difference or intermediate frequency, using a package that permits accurate adjustment of the components and elements, rapid and simple inspection of the internal elements, and minimum rf leakage; and which can be fabricated from lightweight plastic plated to provide the desired conductiv8 surfaces.

In addition to the structural advantages provided, the invention incorporates a novel arrangement of an integral collection box coupled to the IF output of the mixer portion to collect the signal of the IF output and amplify, condition, and/or demodulate the signal as desirable prior to supplying it to a following circuit or apparatus, in a lower-noise matching manner.

As will be seen, the block construction eliminates the need for soldering or brazing. Also, it will be apparent that the method of fabrication permits ease of internal inspection of the components and elements of the device by means of a removable cover which introduces no discontinuities into the waveguide passageways. Excellent inherent rf shielding is obtained and lead lenghts are minimized.

A particular feature of the invention is the arrangement of the parts of the device which, in the case of a mixer device, utilizes tandem adjustments of diode chucks to permit accurate positioning of the mixer diodes within the mixer body, the diodes thereby being settable and biased for minimum noise figures.

Accordingly it is a general object of this invention to provide a millimeter wave device fabricated from inexpensive, lightweight plastic material. It is a further general object to provide a plastic device of block construction having a waveguide therein and defining a collection box well integral with the device, and having a cover for the well, there being a coupling passageway communicating between the waveguide passageway and the collection box well.

It is a particular object to provide a millimeter device having a plastic body of block construction, comprised of two parts removably secured together and defining therebetween a rectangular waveguide, one of whose surfaces is defined by one of the body parts and another of the surfaces defined by the other of the body parts. It is a further object to provide such a device in which one of the surfaces of the body part is generally planar and coextensive with a surface of the waveguide, the other of the body parts thereby defining three of the waveguide surfaces.

It is yet another object to provide a packaging for a millimetric device comprised of two body parts removabley secured together in which one of the body parts defines one wall of the output arms of a hybrid junction and the other body part defines the remaining walls of the output arms, whereby the junction elements are adapted to rapid and complete inspection by the separation of the body parts.

Other and further objects will be immediately apparent to those skilled in the art upon examination of the drawings when considered in the light of the following description of a preferred embodiment.

DESCRIPTION OF THE PREFERRED EMBODIMENT

Figure 1:
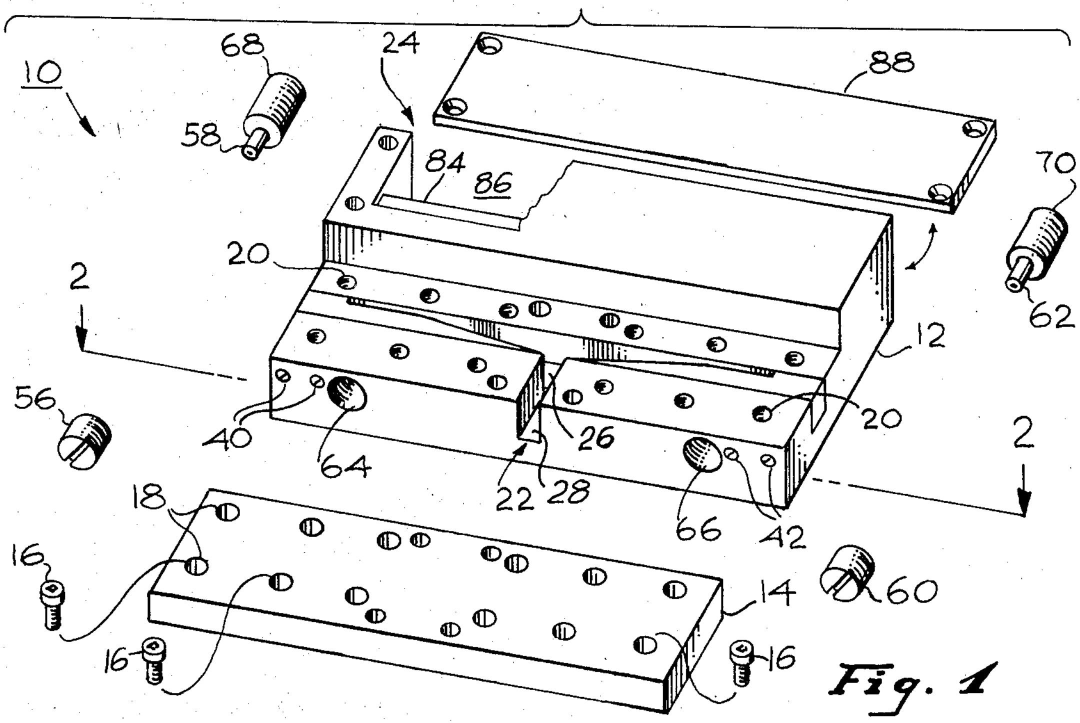
FIG. 1 is a perspective view of one form of the invention depicted in exploded fashion to show the principal members of the package arrangement.

Referring to the drawings there is shown a package arrangement 10 of the invention as incorporated in a millimeter wave mixer. The arrangemnt 10 is comprised of block body parts 12 and 14 arranged to be removably secured together, as by a plurality of screws, three of which are illustrated at 16, disposed through the screw holes 18 in the body part 14 and threadably received in the blind screw holes 20 in the body part 12. Preferably the parts 12 and 14 are secured in face-to-face relationship with the tightest possible means in order to reduce to a minimum the leakage of wave energy from the elements contained in the body arrangement 12, and to this end there may be employed 12 screws for the 12 screw holes in the body parts.

Figure 2:
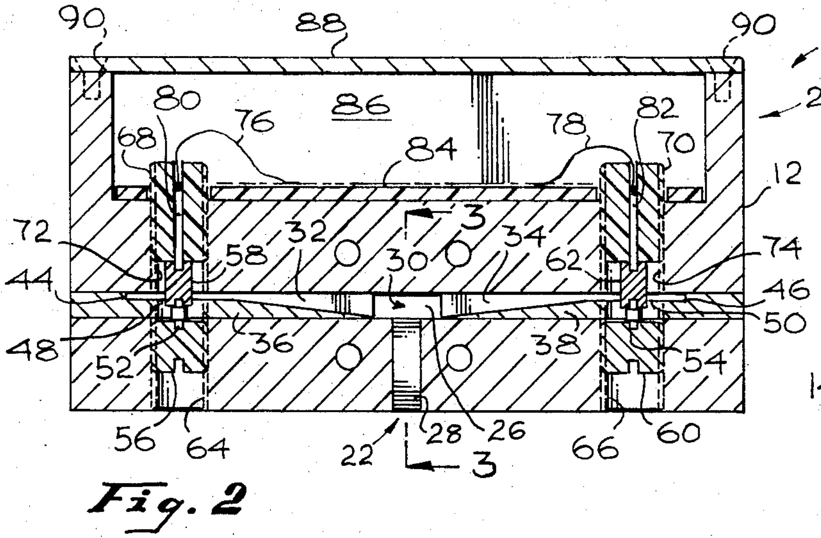
FIG. 2 is a plan view in cross-section taken on a plane through the line 2—2 of FIG. 1, looking in the direction of the arrows.
Figure 3:
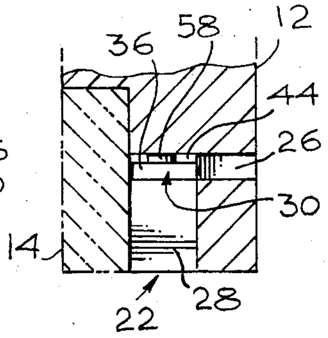
FIG. 3 is a side elevation view in cross-section taken on the line 3—3 of FIG. 2.

The package 10 comprises a two-part arrangement including the millimeter wave mixer portion 22 and a collection box portion 24 formed integral with the body part 12. The mixer portion defines waveguide means including inlet ports 26 and 28 coupled to the hybrid junction 30, as best seen on FIGS. 2 and 3. It will be apparent to those skilled in the art that the junction 30 is the well-known magic T having output arms 32 and 34.

The inlet ports 26 and 28 are adapted for coupling to sources of radio wave energy. For example, the port 26 may be coupled to a source of millimeter wave energy to be heterodyned with a local oscillator source of energy coupled to the port 28. The two frequencies are thus mixed in the junction 30 and the energy of the difference, or intermediate, frequency divides in balanced fashion and flows into the output arms 32 and 34.

Disposed in the respective output arms 32 and 34 are the impedance matching ramp elements 36 and 38 which may be positioned and secured therein by any preferred means, as for example the screws 40 and 42 of FIG. 1. Restricted arm portions 44 and 46, respectively, provide the termination spaces 48 and 50 of the output arms 32 and 34. Disposed in the terminal spaces 48 and 50, respectively, are the mixer diodes 52 and 54, with the diode 52 supported by holder chucks 56 and 58 and the diode 54 by the chucks 60 and 62.

The chuck 56 is threadably disposed in a threaded bore 64 and the chuck 60 in the threaded bore 66, both bores being disposed in and defined by the lower portion of the body part 12. The chuck 58 is secured in a chuck holding member 68 and the chuck 62 in a chuck holding member 70, with the members 68 and 70 threadably disposed in threaded bores 72 and 74, respectively, disposed in and defined by the intermediate portion of the body part 12. The axes of the bores 64 and 72, and hence of the chucks 56 and 58, coincide. Thus there is provided a novel adjustment means for complete adjustment postioning of the diode 52 within the termination space 48 for optimum noise figure. As can be seen, the adjustment is readily accomplished from the exterior of the waveguide means. The same coincident relationship pertains to the axes of the bores 66 and 74 and hence provides for the adjustability of the diode 54 in the termination space 50.

The diode 52 has its anode and cathode electrodes coupled to the chucks 56 and 58 and the diode 54 has its electrodes coupled to the chucks 60 and 62. The upper chucks 58 and 62 are coupled to circuit conductors 76 and 78, respectively, through the connectors 80 and 82 disposed in the holder members 68 and 70. The conductors 76 and 78 are adapted for coupling to biasing and output elements arranged on a circuit board 84. Conductor 76 provides both bias and output coupling for the diode 52 in cooperation with the chuck 56. Conductor 78 cooperates with chuck 60 in the same manner for the diode 54.

As previously mentioned, the packaging arrangemnt 10 comprises the collection box portion 24 which includes a well 86 defined by the block body part 12. The circuit board 84 and output elements of the mixer arrangement are contained in the collection box well 86, which is provided with a cover 88 adapted to be removably secured to the box portion 24 by screws 90. The cover 88 is shown rotated 90° from the assembled position along the remote end of the body part 12, as indicated by the arrow.

Figure 4:
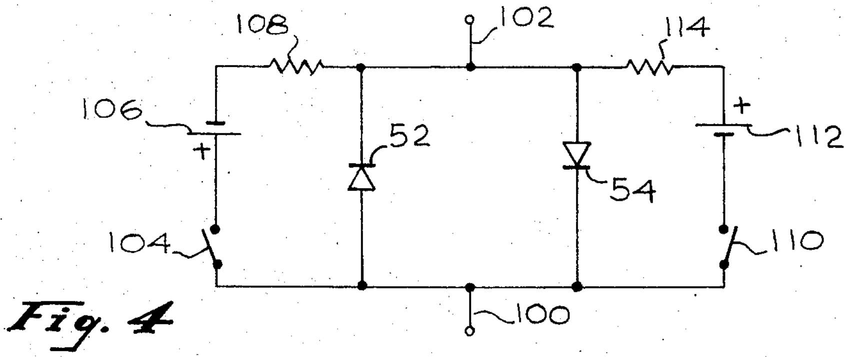
FIG. 4 is a schematic circuit diagram of the signal output elements of the mixer.

The circuit board 84 and aforementioned elements, together with the diodes 52 and 54, may be coupled after the fashion shown schematically on FIG. 4. As shown there, the diodes 52 and 54 have their respective anode and cathode electrodes coupled to a common reference conductor 100 which may be grounded. The respective cathode and anode electrodes of the diodes 52 and 54 are coupled to an output conductor 102. The bias circuit for the diode 52 comprises the switch 104 having one contact coupled to the anode of diode 52 and the other contact to the positve side of the battery 106 whose negative side is coupled to the bias resistor 108 to the cathode of diode 52. The bias circuit for the diode 54 comprises a switch 110 having one contact coupled to the cathode of diode 54 and the other contact coupled to the negative side of the battery 112 whose positive side is coupled through the bias resistor 114 to the anode of the diode 54. The output conductor 102 may be coupled to any following circuit as desired, preferably through a preamplifier disposed on the board 84.

As noted above, the diodes 52 and 54 have their respective cathode and anode electrodes coupled to the output conductor 102. Although not shown, it will be understood that blocking capacitors may be provided in the respective conductive paths leading to the output terminals to block the DC voltage of the bias circuits from entering the IF output ports. With the arrangements shown all batteries, switches, resistors, and other components are located within the integral collection box, self-contained, compact and protected.

The packaging arrangement as disclosed lends itself to inexpensive mass production methods by metal casting or to lightweight, low-cost plastic fabrication with conductive surfaces goldplated. If the package is metal, the body parts provide the reference grounded conductor for the input waveguide means and the output IF circuit, as well as providing for DC bias on electrodes of the mixer diodes 52 and 54 through their chucks 56 and 60 respectively. It will be apparent, of course, that the chuck holding members 68 and 70 must be insulators to prevent the grounding of the circuit conductors 76 and 78 coupled to the cathode and anode electrodes of the diodes 52 and 54.

Those skilled in the art will now recognize the novel elements of the invention wherein millimeter wave devices may be inexpensively fabricated with an integral collection box arrangement. They will also recognize the novel aspects of the simple arrangement providing adjustable positioning of semiconductor elements within a waveguide means by means located externally of millimeter waveguide device.

What is claimed is:

1. A packaging arrangement for a millimeter wave mixer to provide an output signal to a following circuit comprising:

a. a block body defining waveguide means and a hybrid junction circuit communicating with said waveguide means for the input of millimeter wave energy from said waveguide means to said junction circuit, said junction circuit having output arm means extending therefrom;

b. semiconductor holder means adjustably disposed in said body; and c. semiconductor mixer means disposed in said holder means and extending into said output arm means, whereby the depth of penetration of said mixer means into said output arm means may be adjusted by said holder means, said body further defining output signal coupling means coupled to said mixer means.

2. The packaging arrangement of claim 1 in which said holder means comprises a pair of chuck means arranged to hold a semiconductor mixer element of said mixer means between each chuck means of said pair, and said each chuck means of said pair is threadably disposed in said body for tandem adjustment movement of said pair along a common axis substantially normal to the axis of said output arm means of said junction circuit.

3. The packaging arrangemnt of claim 1 in which said output arm means of said junction circuit comprises first and second output arms, and said holder means comprises first and second holder means adjustably disposed in said body, and said mixer means comprises first and second mixer means disposed respectively in said first and said second holder means and extending respectively into said first and second output arms.

4. The packaging arrangement of claim 3 in which said first holder means comprises a first pair of chuck means arranged to hold said first mixer means therebetween, each of said first pair of chuck means being threadably disposed in said body for tandem adjustment movement of said first pair along a common axis substantially normal to the axis of said first output arm, and said second holder means comprises a second pair of chuck means arranged to hold said second mixer means therebetween, each of said second pair of said chuck means being threadably disposed in said body for tandem adjustment movement of said second pair along a common axis substantially normal to the axis of said second output arm.

5. The packaging arrangement of claim 4 in which said output arm means further comprises first and second impedance matching ramp means disposed respectively in said first and second output arms.

6. The packaging arrangement of claim 5 in which said body comprises first and second body members removably secured together, one of said body members defining one of the walls of said output arm means and the other of said body members defining the remaining walls, whereby when said first body member is removed from said second body member said ramp means are exposed for inspection.

7. The packaging arrangement of claim 1 in which said body is formed of lightweight inexpensive plastic material.

8. The packaging arrangement of claim 7 in which said body defines a collection box well integral with said body for the diposition therein of collection circuit means coupled to said mixer means.

9. A packaging arrangement for millimeter wave apparatus comprising:

a. a block body defining a first waveguide passageway therein for the propagation of millimeter wave energy therealong, said body also defining a collection box well open on one side, said body further defining a first coupling passageway providing electrical communication between said waveguide passageway and said collection box well; and b. box cover means removably secured over said open side of said collection box well.

10. The packaging arrangement of claim 9 in which said body is comprised of lightweight inexpensive plastic material with the walls of said waveguide passageway being provided with a conductive metal surface.

11. The packaging arrangement of claim 9 in which said body comprises:

a. a first body member; and b. a second body member removably secured to said first body member, said waveguide passageway being of rectangular configuration having one wall thereof defined by one of said body members and three walls thereof defined by other of said body members.

12. The packaging arrangement of claim 11 in which one of said body members defines a second waveguide passageway and said body further defines a hybrid junction circuit coupled to both said waveguide passageways to provide a mixer for wave energy flowing thereinto from said waveguides, said coupling passageway being coupled to said junction circuit.

13. The packaging arrangement of claim 12 in which said body defines an impedance matching ramped passageway providing said coupling between said coupling passageway and said junction circuit.

14. The packaging arrangement of claim 13 including a mixer diode disposed in said coupling passageway at the end thereof at which it is coupled to said ramped passageway.

* * * * *